(12) United States Patent
Matsumoto et al.

(10) Patent No.: US 8,294,332 B2
(45) Date of Patent: Oct. 23, 2012

(54) PRESSURE TRANSDUCER

(75) Inventors: Noriyuki Matsumoto, Yokohama (JP);
Tsutomu Yamate, Yokohama (JP);
Bikash K. Sinha, West Redding, CT
(US); Shigeru Sato, Inagi (JP); **Anthony
Frank Veneruso, Paris (FR); Jimmy
Lawrence, Cambridge, MA (US); Yves
Barriol, Houston, TX (US); Shigeo
Daito**, Lexington, MA (US)

(73) Assignee: Schlumberger Technology Corporation, Sugar Land, TX (US)

( * ) Notice: Subject to any disclaimer, the term of this patent is extended or adjusted under 35 U.S.C. 154(b) by 309 days.

(21) Appl. No.: 11/772,244

(22) Filed: Jul. 2, 2007

(65) Prior Publication Data
US 2009/0009036 A1 Jan. 8, 2009

(51) Int. Cl.
*H01L 41/04* (2006.01)
*H01L 41/053* (2006.01)

(52) U.S. Cl. .................. 310/320; 310/338; 310/348

(58) Field of Classification Search .......... 310/320, 310/324, 338, 344, 348
See application file for complete search history.

(56) References Cited

U.S. PATENT DOCUMENTS

| | | | |
|---|---|---|---|
| 3,561,832 A | 2/1971 | Karrer et al. | |
| 3,617,780 A | 11/1971 | Benjaminson et al. | |
| 4,356,423 A * | 10/1982 | Gudzin | 310/338 |
| 4,419,600 A | 12/1983 | Sinha | |
| 4,511,821 A * | 4/1985 | Nakamura et al. | 310/354 |
| 4,547,691 A | 10/1985 | Valdois et al. | |
| 4,562,375 A * | 12/1985 | Besson et al. | 310/338 |
| 4,754,646 A * | 7/1988 | EerNisse et al. | 73/702 |
| 4,802,370 A * | 2/1989 | EerNisse et al. | 73/702 |
| 5,221,873 A | 6/1993 | Totty et al. | |
| 5,394,345 A | 2/1995 | Berard et al. | |
| 5,471,882 A | 12/1995 | Wiggins | |
| 5,578,759 A | 11/1996 | Clayton | |
| 6,111,340 A * | 8/2000 | Sinha et al. | 310/361 |
| 6,147,437 A * | 11/2000 | Matsumoto et al. | 310/338 |
| 6,300,707 B1 * | 10/2001 | Takehana et al. | 310/348 |
| 2007/0186657 A1 | 8/2007 | Sato et al. | |
| 2009/0303487 A1 | 12/2009 | Bond et al. | |

FOREIGN PATENT DOCUMENTS

| | | |
|---|---|---|
| EP | 0054447 | 9/1988 |
| EP | 0054447 B1 | 9/1988 |
| WO | 00/14500 | 3/2000 |
| WO | 00/31509 | 6/2000 |

OTHER PUBLICATIONS

Bogoush M.E. et al., "Quartz crystal units with bar piezoelements vibrating in double-shear mode", European Frequency and Time Forum, 1996, p. 116.
B. K. Sinha, "Stress compensated orientations for thickness-shear quartz resonator", Proc. 35th Annual Frequency Control Symposium, pp. 213-221, 1981.

(Continued)

*Primary Examiner* — Derek Rosenau
(74) *Attorney, Agent, or Firm* — Jianguang Du; Jody DeStefanis

(57) ABSTRACT

A pressure transducer for high-pressure measurements comprising a housing and a piezoelectric resonator located in the housing, wherein the resonator comprises double rotation cut piezoelectric material configured or designed for vibrating in the fundamental tone of dual modes of the fast and slow thickness-shear vibrations.

32 Claims, 21 Drawing Sheets

OTHER PUBLICATIONS

B. K. Sinha, "Doubly Rotated Contoured Quartz Resonators", IEEE Transactions on Ultrasonics, Ferroelectrics, and Frequency Control, vol. 48, No. 5, pp. 1162-1180, Sep. 2001.

O. Vallin, et. al., "Direct bonded quartz resonators", Frequency Control Symposium and PDA Exhibition, 2001, Proceedings of the IEEE International, pp. 345-348, Jun. 6-8, 2001.

M. Valdois, et al., "Experimental Verification of Stress Compensation in the SBTC-Cut", IEEE Transactions on Ultrasonics, Ferroelectics and Frequency Control, vol. 36, No. 6, Nov. 1989.

B.K. Sinha, "Thickness Modes of Vibration of Contoured SBTC-Cut Quartz Plates", IEEE 1990 Ultrasonics Symposium, Dec. 4-7, Honolulu, Hawaii.

* cited by examiner

PRESSURE TRANSDUCER

FIELD

The present disclosure relates generally to pressure transducers. More specifically, some aspects disclosed herein are directed to pressure sensors that are suitable for applications relating to oilfield wells or in pipelines.

BACKGROUND

Piezoelectric pressure and temperature sensors typically have a crystal resonator located inside a housing with electrodes. Environmental pressure and temperature are transmitted to the resonator, via the housing, and changes in the resonator are sensed and used to interpret the pressure and/or temperature. U.S. Pat. No. 3,617,780 describes one example of a piezoelectric pressure transducer. In conventional devices, known as single-mode transducers that utilize single-mode oscillation, the resonator is affected by both temperature and pressure such that some devices may not be suitable for use in environments where both temperature and pressure vary.

One approach that is utilized to minimize fluctuations in pressure measurements is to use resonators with dual-mode oscillation. U.S. Pat. Nos. 4,419,600, 4,547,691 and 5,394,345 disclose examples of such pressure transducers. However, transducer geometry for such resonators tends to be relatively more complex, and the transducer tends to be larger due to the manufacturing process. Under certain conditions, such as in oil or gas wells, stress on the transducer may cause material twinning or micro-cracks that might damage the pressure transducer.

Pressure transducers using thickness shear vibrations typically utilize the aforementioned single-mode oscillation. In such cases, although the geometry of single-mode transducers may be simpler than dual-mode transducers, such transducers provide only pressure data. In this, temperature data has to be obtained from a separate temperature sensing device, preferably located close to the transducer, which makes the temperature compensation process relatively slower with potential inaccuracies.

As will become apparent from the following description and discussion, the present invention overcomes at least some of these deficiencies and provides an improved pressure transducer.

BRIEF SUMMARY OF THE INVENTION

In one aspect of the present invention, a pressure transducer comprising a housing and a piezoelectric resonator located in the housing. The resonator comprises double rotation cut piezoelectric quartz material configured or designed for vibrating in the fundamental tone of dual modes of the fast and slow thickness-shear vibrations. In some aspects disclosed herein, the resonator may be an SBTC-cut quartz piezoelectric resonator. In other aspects herein, the resonator comprises a bi-convex resonator located in a radial plane of the housing such that the pressure transducer comprises an axi-symmetrical configuration.

The transducer housing may be axi-symmetrical and the resonator may be located in a radial plane within the housing with a peripheral portion sandwiched between end caps of the housing. In aspects herein, the end caps may be fusion bonded to the peripheral portion of the resonator. In yet other aspects, the end caps may be bonded to the peripheral portion of the resonator by metal-metal bonding. In further aspects herein, the end caps may be bonded to the peripheral portion of the resonator by a glass sealant.

Each end cap of the transducer may comprise at least one of an inner surface and an outer surface that is curved. A respective resonator electrode may be provided on an inner surface of each end cap such that the electrodes are not in contact with the resonator; and each end cap may have at least one aperture with wiring for electrical connection between the inner surface electrodes and corresponding external electrodes on outer surfaces of the end caps. The apertures may be filled with a sealant.

In aspects disclosed herein, the resonator may be a bi-convex resonator; a plano-convex resonator; and a resonator having different radii of curvature along two orthogonal axes thereof. The housing may comprise a body section that is cylindrical in shape; at least one end cap at one end of the body section; and the resonator may be located in a radial plane of the housing within the body section. In aspects herein, a pair of end caps may be provided at opposite ends of the body section; and each end cap may have at least one surface that is hemispherically curved.

In aspects herein, the transducer may have a housing that is axi-symmetrical; the resonator may be located in a radial plane within the housing, the resonator comprising a peripheral portion sandwiched between end caps of the housing; and an inner surface of at least one end cap may be contoured so as to be adjacent to a surface of the resonator. The transducer may further comprise a bonding layer between the at least one end cap and the peripheral portion of the resonator, wherein the contoured inner surface of the at least one end cap is separated from the surface of the resonator with a constant gap that is equal to the thickness of the bonding layer. In other aspects herein, the contoured inner surface of the at least one end cap may be separated from the surface of the resonator with a gap that is greater than the thickness of the bonding layer. Aspects disclosed herein provide a resonator having a peripheral portion sandwiched between end caps of the housing with the resonator having a generally H-shape in cross section.

In aspects disclosed herein, the transducer further comprises resonator electrodes configured or designed for inducing fundamental tone vibrations in the resonator, wherein the resonator electrodes are configured or designed to maximize the motional capacitance of at least the fundamental tone and to reduce the motional capacitance of unwanted anharmonic overtones under a predetermined level.

One piezoelectric resonator comprises quartz crystal with a double rotation cut of angles φ(phi)=16.3 degrees, plus or minus 4 degrees, and θ(theta)=−34.5 degrees, plus or minus 4 degrees. Another piezoelectric resonator comprises quartz crystal with a double rotation cut of angles φ(phi)=1 degree, plus or minus 4 degrees, and θ(theta)=−23 degrees, plus or minus 4 degrees. Yet another piezoelectric resonator comprises quartz crystal with a double rotation cut of angles φ(phi)=13 degrees, plus or minus 4 degrees, and θ(theta)=−27.5 degrees, plus or minus 4 degrees. A further piezoelectric resonator comprises quartz crystal with a double rotation cut of angles φ(phi)=14.2 degrees, plus or minus 4 degrees, and θ(theta)=−30 degrees, plus or minus 4 degrees.

The disclosure herein provides a tool for pressure measurements comprising a pressure transducer; and a temperature sensor disposed on or near an outer surface of the pressure transducer, wherein the transducer comprises a housing and a piezoelectric quartz resonator located in the housing, wherein the resonator comprises double rotation cut piezoelectric material configured or designed for vibrating in the fundamental tone of dual modes of the fast and slow thickness-shear vibrations. A method is provided comprising assembling a pressure transducer comprising a housing and a piezoelectric quartz resonator located in the housing, wherein the resonator comprises double rotation cut piezoelectric material configured or designed for vibrating in the fundamental tone of dual modes of the fast and slow thickness-shear vibrations; and selecting an aspect ratio (R/t) of the resonator such that anharmonic overtones are separated from the fundamental mode of resonance.

Additional advantages and novel features of the invention will be set forth in the description which follows or may be learned by those skilled in the art through reading the materials herein or practicing the invention. The advantages of the invention may be achieved through the means recited in the attached claims.

BRIEF DESCRIPTION OF THE DRAWINGS

The accompanying drawings illustrate preferred embodiments of the present invention and are a part of the specification. Together with the following description, the drawings demonstrate and explain principles of the present invention.

Figure 1:
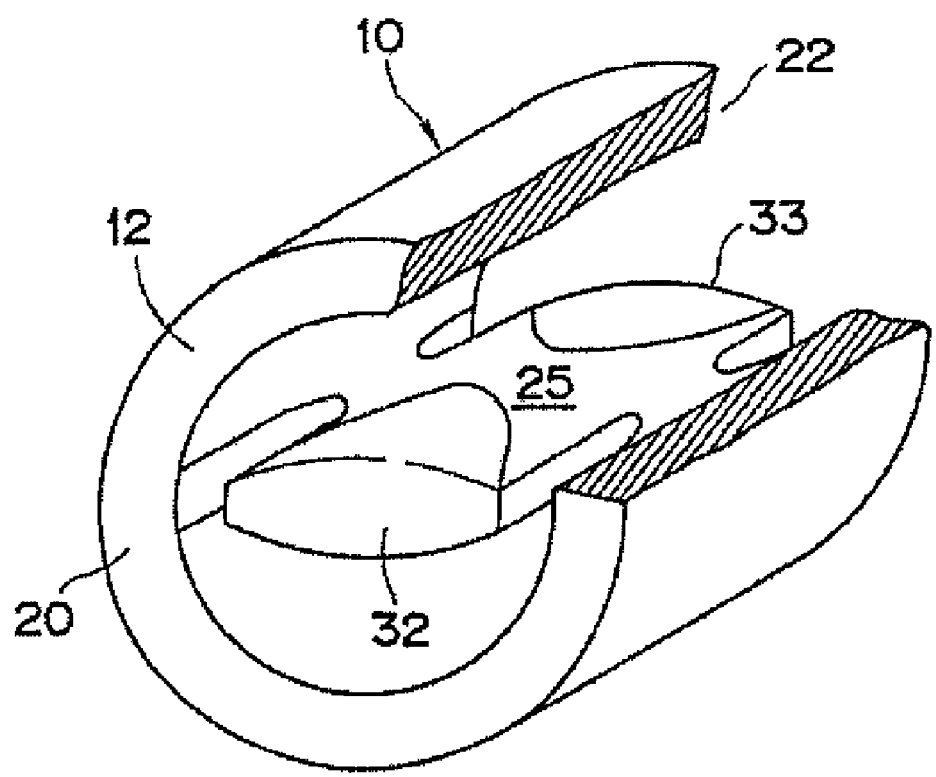
FIG. 1 shows an exemplary dual-mode oscillation transducer.

Throughout the drawings, identical reference numbers indicate similar, but not necessarily identical elements. While the invention is susceptible to various modifications and alternative forms, specific embodiments have been shown by way of example in the drawings and will be described in detail herein. However, it should be understood that the invention is not intended to be limited to the particular forms disclosed. Rather, the invention is to cover all modifications, equivalents and alternatives falling within the scope of the invention as defined by the appended claims.

DETAILED DESCRIPTION

Illustrative embodiments and aspects of the invention are described below. In the interest of clarity, not all features of an actual implementation are described in the specification. It will of course be appreciated that in the development of any such actual embodiment, numerous implementation-specific decisions must be made to achieve the developers' specific goals, such as compliance with system-related and business-related constraints, that will vary from one implementation to another. Moreover, it will be appreciated that such development effort might be complex and time-consuming, but would nevertheless be a routine undertaking for those of ordinary skill in the art having benefit of the disclosure herein.

FIG. 1 depicts one example of a classic pressure transducer having two vibrational modes at different frequencies, known as C mode and B mode. C mode is responsive to variations in both pressure and temperature, whereas the B mode is responsive primarily to temperature, with the affect of pressure being relatively small. Referring to FIG. 1, the transducer 10 has a resonator 25 in a cylindrical housing 12 with the ends 32, 33 of the resonator 25 being unconnected to the annular ends 20, 22 of the housing 12. Electrodes are provided to excite vibrational behavior. In this, the resonator is structured so as to maximize the stress anisotropy in one direction as compared to the other in order to obtain stress-induced changes in one of the thickness-shear modes. Moreover, the ratio of the stresses should be as large as possible, preferably zero stress in one direction.

Typically, commercially available pressure transducers that use thickness shear vibrations utilize single-mode oscillation. Since the transducer uses a singly-rotated cut of quartz, and usually does not require stress anisotropy in the resonator, the geometry of the transducer may be much simpler than that of the dual-mode transducer shown in FIG. 1. For example, a bamboo like axi-symmetric structure may be adopted for the single-mode transducer. However, in single-mode transducers only pressure information can be obtained. Temperature information has to come from another temperature sensing device, preferably located close to the transducer.

Figure 2A:
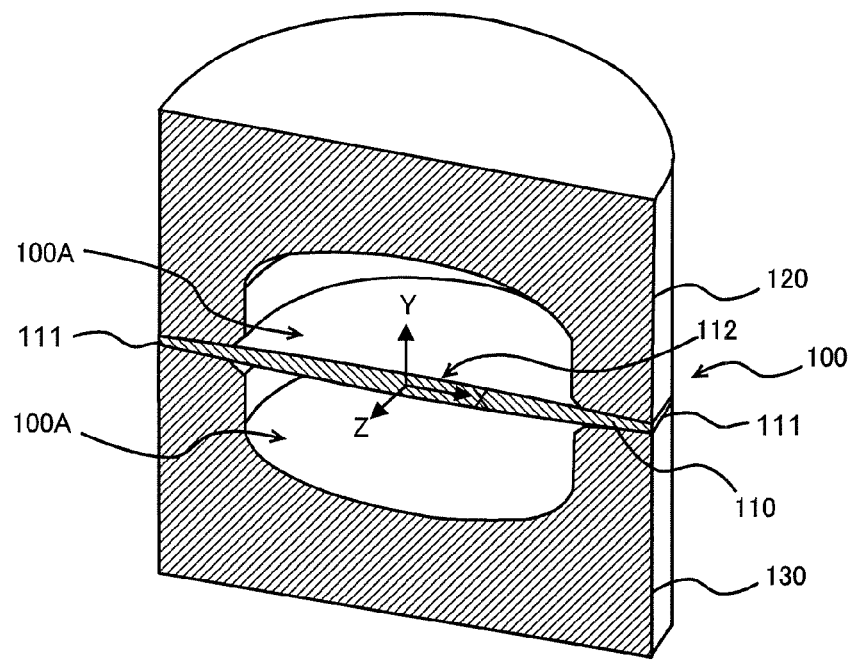
FIGS. 2A and 2B are cross-sectional views of exemplary pressure transducers according to the disclosure herein.
Figure 2B:
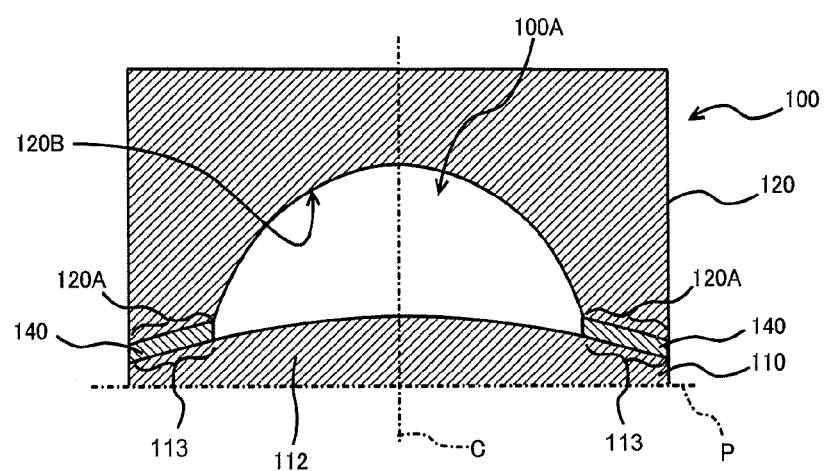

Referring now to FIG. 2A, a pressure transducer 100 of the present invention comprises an axi-symmetric housing 120, 130 that is hollow inside and a bi-convex resonator 112 located in a radial plane within the housing. According to a first embodiment, the resonator 112 includes a plate portion 110 with a circumferential edge surface 110A. End caps 120, 130 are at opposite sides of the plate 110. The end caps 120, 130 are attached to the plate 110 so as to define a cavity 100A within which the resonator 112 is located. The plate 110 of the resonator 112 and the end caps 120, 130 may be formed as unitary axi-symmetric structures from a crystal quartz block. Thus, the plate 110 and end caps 120, 130 are plane-symmetric about a center plane P and axi-symmetric about axis C, as shown in FIG. 2B. The end caps 120, 130 are attached to the ends 110B of plate 110 via bonding interfaces 140. Each radius of curvature of bonded surfaces of end caps 120, 130 may be the same as the radius of curvature of corresponding bonded surfaces of plate 110. For example, the radius of curvature of bonded surface 120A of end cap 120 may be the same as the radius of curvature of bonded surface 113 of plate 110. The inner surface 120B of end cap 120 may be hemispherical or quasi-hemispherical in shape, as shown in FIG. 2B, with the same shape for end cap 130. Transducer 100 of FIGS. 2A and 2B has reduced shear stress at the bonding interfaces/layers between the end caps 120, 130 and the plate 110, and reduced hysteresis and long-term drift in output of the transducer 100. In other embodiments, the inner surfaces of the end caps 120, 130 may be elliptical in cross-sectional shape, that is, quadratic surfaces.

Crystal quartz used in embodiments herein comprises double rotation cut piezoelectric quartz material capable of vibrating in dual modes of fast and slow thickness-shear vibrations. A thickness mode quartz resonator vibrates in three modes of motion, the thickness-extensional or "A" mode, the fast thickness-shear or "B" mode, and the slow thickness-shear or "C" mode, such that resonant frequencies follow the relation $f_A > f_B \geq f_C$.

One double rotation cut quartz that may be used is SBTC (stress compensated in B-mode and temperature compensated in C-mode) cut quartz having, for example, angles φ(phi)=16.3 degrees, plus or minus 4 degrees, and θ(theta)=−34.5 degrees, plus or minus 4 degrees, as described in U.S. Pat. No. 4,419,600, European Patent Application No. 81401760.4, Publication No. 0054447/B1, published on Sep. 14, 1988, and B. K. Sinha, "Stress compensated orientations for thickness-shear quartz resonator", Proc. 35th Annual Frequency Control Symposium, pp. 213-221, 1981 (hereinafter refer to as "Reference (1)"). The aforementioned U.S. Pat. No. '600 is incorporated herein by reference in its entirety. The crystalline orientations of doubly-rotated resonators follow the Standard on Piezoelectric Crystals, 1949, published in the Proceedings of the Institute of Radio Engineers, New York, December 1949.

Figure 3A:
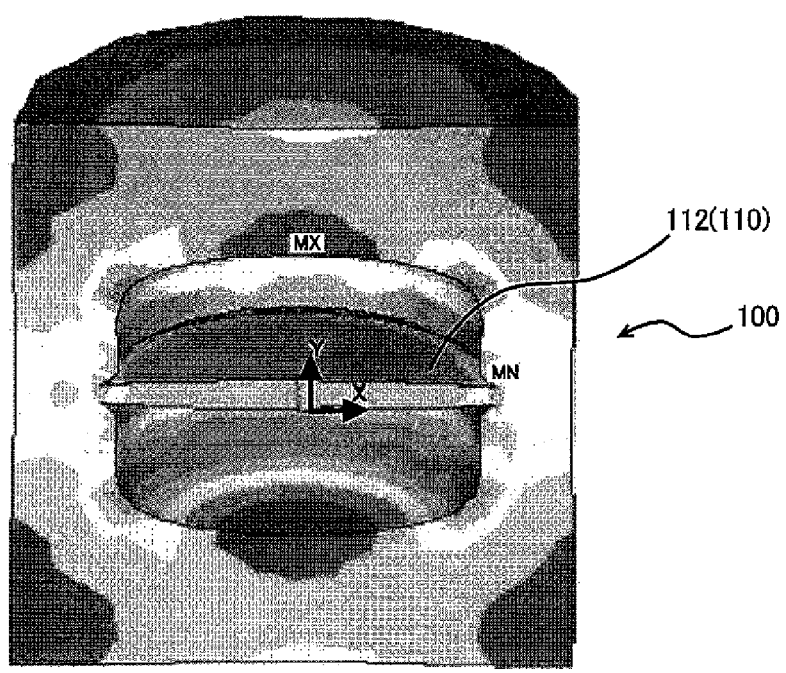
FIGS. 3A-3C depict results of stress distribution in a pressure transducer as discussed in the disclosure herein.
Figure 3B:
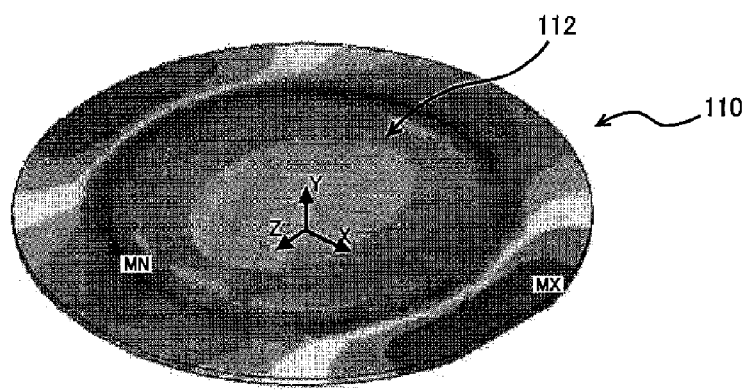
Figure 3C:
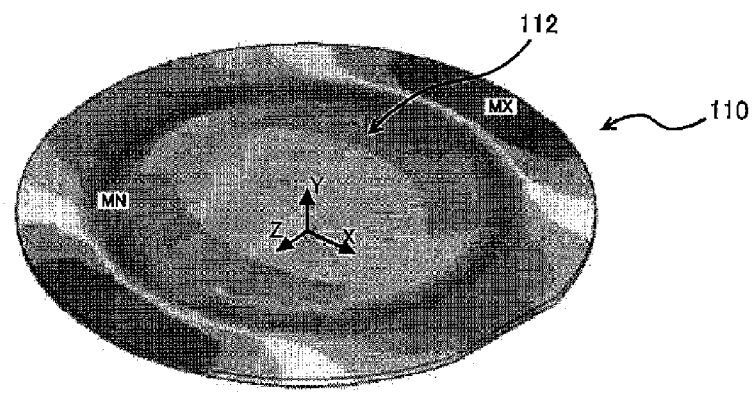
Figure 4:
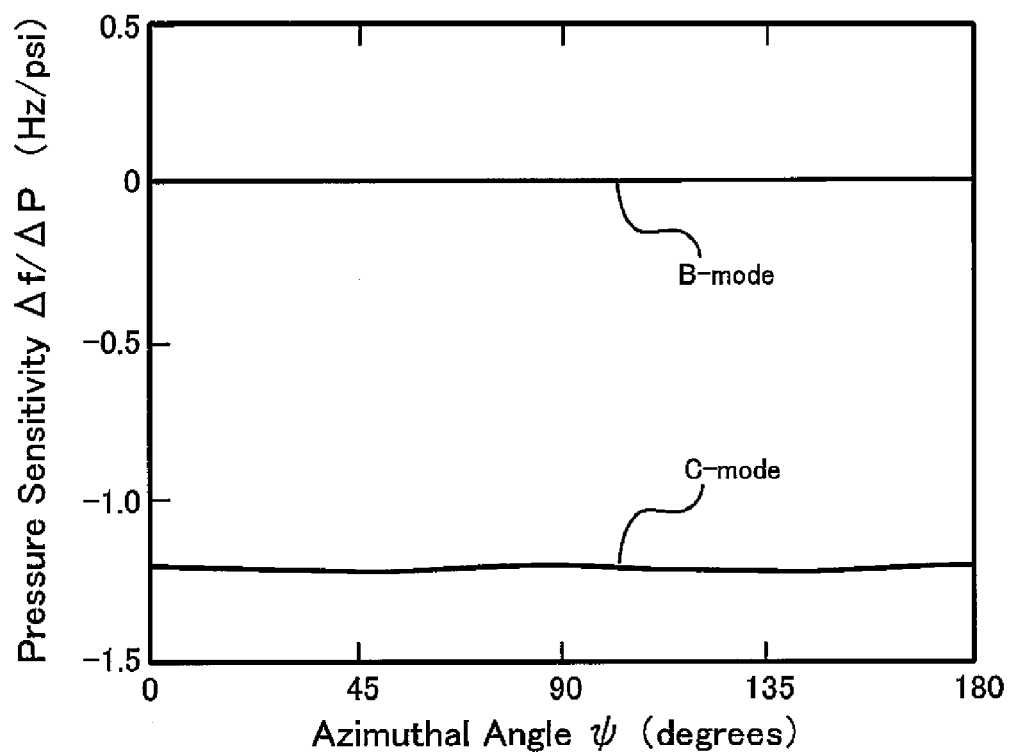
FIG. 4 shows pressure sensitivity estimates computed for temperature sensitive B-mode oscillation and pressure sensitive C-mode oscillation of a transducer as discussed in the disclosure herein.

FIGS. 3A-3C show distribution of the third principal stress generated in a transducer 100 of SBTC cut quartz. In FIG. 3A, the third principal stress is computed at predefined nodes in the transducer 100. Symbols "MX" and "MN" indicate the maximum point and the minimum point of the computed stress, respectively. FIG. 3B shows stress distribution of normal stress along X axis in a disk 110 with resonator 112 and FIG. 3C shows stress distribution of normal stress along Z axis in the disk 110. FIGS. 3B and 3C show that the stresses along both X and Z directions in the resonator 112 are relatively uniform. FIG. 4 shows pressure sensitivity (Hz/psi) estimates computed for temperature sensitive B-mode oscillation and pressure sensitive C-mode oscillation of transducer 100. As evident in FIG. 4, the C-mode has pressure sensitivity of approximately −1.2 Hz/psi whereas the B-mode has almost zero sensitivity.

The disclosure herein contemplates other quartz cuts, for example, φ(phi)=1 degree and θ(theta)=−23 degrees, φ(phi)=13 degrees and θ(theta)=−27.5 degrees, or φ(phi)=14.2 degrees and θ(theta)=−30 degrees (all having tolerance of plus or minus 4 degrees). The aforementioned orientations also lie on the stress compensated loci of orientations for the B-mode of vibration as described in the aforementioned Reference (1). Consequently, similar to the case of SBTC cut, changes in the resonant frequency of B-mode can be used to measure the temperature of the sensing element/resonator more reliably because of significantly reduced sensitivity to applied stresses in the transducer with an axi-symmetric resonator. Changes in the resonant frequency of C-mode can then be used to measure the applied hydrostatic pressure to the transducer with reduced sensitivity to changes in temperature of the sensing element/resonator.

Figure 5A:
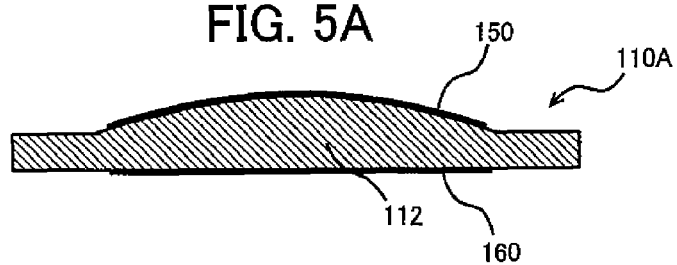
FIGS. 5A-5E show examples of cross-sectional shapes of exemplary resonators according to the disclosure herein.
Figure 5B:
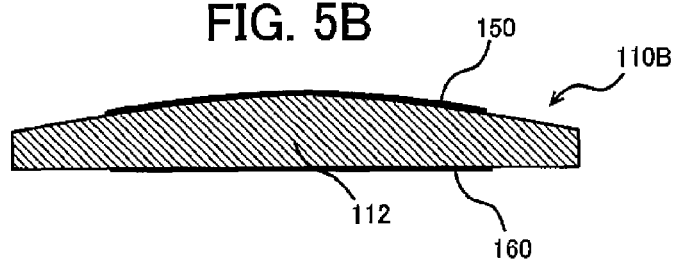
Figure 5C:
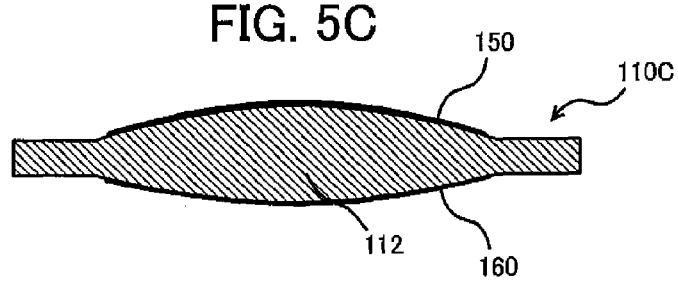
Figure 5D:
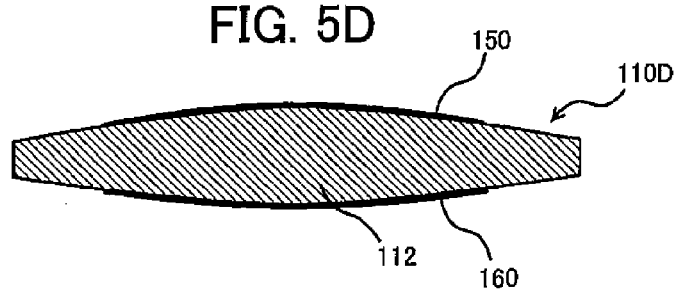
Figure 5E:
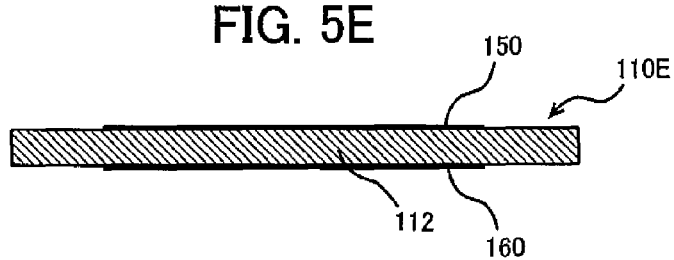

FIGS. 5A-5E show some examples of cross sectional shapes for resonators. Electrodes 150, 160 are provided on opposite surfaces in central portions of the plate 110A, 110B, 110C, 110D, 110E by conventional methods, such as vacuum evaporation deposition and sputtering. The electrode material is typically gold where an intermediate layer of chromium may be used to inhibit migration of gold into the quartz material. Thickness of the electrodes 150, 160 may be in the order of a few 100 Angstrom. The resonating element 112 is formed in the portion between the electrodes 150, 160. One shape of the resonator 112 may be plano-convex as shown in FIGS. 5A and 5B. By using the plano-convex resonator, energy of thickness vibrations can be trapped in the resonator 112 so as to reduce mounting losses and possible reflections of anharmonic overtones from the electrode and plate boundaries. In other words, the plano-convex resonator reduces undesired modes of vibration and confines resonant vibration energy as much as possible for a high Q-value. Other shapes, of the resonator may also be adopted, such as a bi-convex resonator, shown in FIGS. 5C and 5D, or a flat resonator, as shown in FIG. 5E. In plano-convex and bi-convex resonators, the circumferential end portions surrounding the resonating element 112 of the plate 110A, 110C may be flat, as shown in FIGS. 5A and 5C, so that good sealing may be obtained between the plate 110 and end caps 120, 130 without having to shape the end surfaces of the end caps 120, 130.

Figure 6:
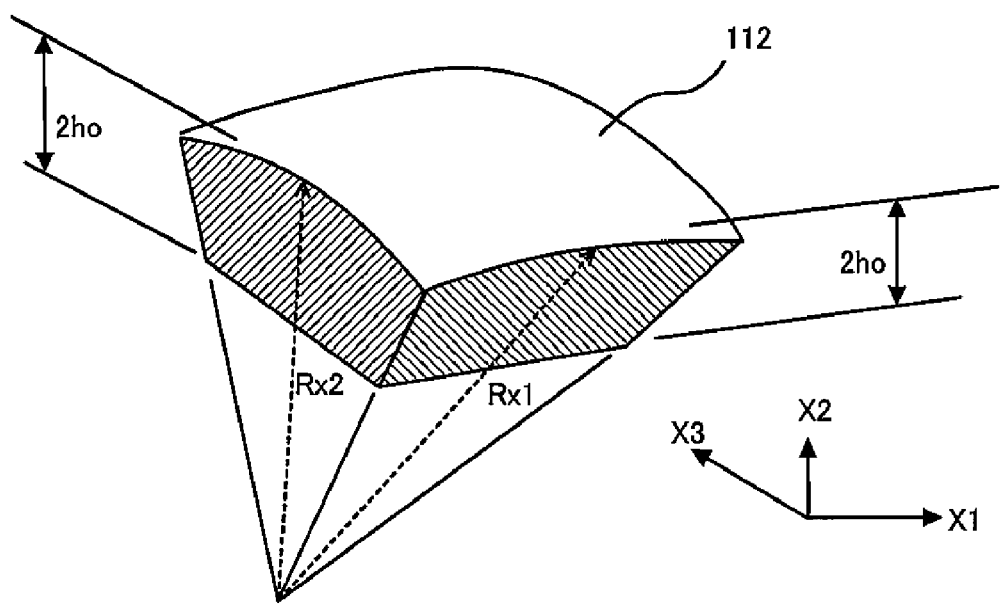
FIG. 6 is a schematic diagram of one non-spherically contoured plano-convex resonator.

By adjusting curvatures of the convex surfaces, it is possible to reduce reflections of anharmonic overtones from the electrode edges and increase the frequency separation between the mode of interest and unwanted modes, as described in further detail hereinafter. The convex surface of the resonator 112 may have different radii of curvature along mutually crossing directions that are designated as X and Z directions in FIG. 2. Referring to FIG. 6, for example, the radii of curvature $R_{X1}$, $R_{X3}$ along the X1 and X3 directions on the resonator surface 112 may be adjusted as described in B. K. Sinha, "Doubly Rotated Contoured Quartz Resonators", IEEE Transactions on Ultrasonics, Ferroelectrics, and Frequency Control, Vol. 48, No. 5, pp. 1162-1180, September 2001 (hereinafter refer to as "Reference (2)"). By using a non-spherically contoured plano-convex resonator, having different radii of curvature along mutually crossing directions, the excitation of certain anharmonic overtones can be suppressed.

For example, a spherically contoured SBTC plano-convex resonator with a spherical radius of curvature R=260 mm exhibits fundamental harmonic and anharmonic overtones for the B-mode of vibration as shown in Table 1. Resonant frequencies for the B-mode in Table 1 are computed for a plano-convex resonator of spherical radius of curvature R=260 mm, plate thickness at the center 2ho=1.0679 mm, and gold electrodes of thickness 800 Angstrom. The electrode shape is assumed to be a square of side 8 mm.

TABLE 1

| n | m | p | Frequency (kHz) |
|---|---|---|---|
| 1 | 0 | 0 | 2138 |
| 1 | 0 | 2 | 2207 |
| 1 | 0 | 4 | 2274 |
| 1 | 2 | 0 | 2256 |
| 1 | 2 | 2 | 2321 |
| 1 | 2 | 4 | 2385 |
| 1 | 4 | 0 | 2368 |

TABLE 1-continued

| n | m | p | Frequency (kHz) |
|---|---|---|---|
| 1 | 4 | 2 | 2430 |
| 1 | 4 | 4 | 2491 |

However, if the radius of curvature along $X_1$ is 260 mm and along $X_3$ is 86.6 mm, the corresponding fundamental harmonic and anharmonic overtones for the B-mode of vibration are given by a different spectrum as shown in Table 2.

TABLE 2

| n | m + p | Frequency (kHz) |
|---|---|---|
| 1 | 0 | 2151 |
| 1 | 2 | 2268 |
| 1 | 4 | 2380 |
| 1 | 6 | 2486 |
| 1 | 8 | 2588 |

The examples demonstrate how the number of anharmonic overtones (unwanted modes) are reduced from 8 in the case of a spherical contour to 4 in the case of a non-spherical contour. In addition, the difference between the main resonance and the nearest unwanted anharmonic mode is increased from 69 kHz (in the case of a spherical contour) to 117 kHz (in the case of a non-spherical contour). Furthermore, shape and/or size of the electrodes 150, 160 may be adjusted and optimized to maximize the motional capacitance of the preferred harmonic overtone for B-mode and C-mode, and suppress the excitation of unwanted anharmonic overtones by reducing their motional capacitance under a predetermined upper level. The upper level of motional capacitance for the unwanted anharmonic overtones may be set by considering other design parameters of the transducer. The motional capacitance of a mode of resonance is dependent on three design parameters. First, the electromechanical coupling for a given mode of vibration is fixed by the chosen crystalline orientation. Second, the radius of curvature affects the amount of motional capacitance. Generally, larger radius of curvature increases the magnitude of motional capacitance. In addition, the electrode shape and size also affect the magnitude of motional capacitance for a chosen mode of vibration. Generally, larger area electrode increases the magnitude of motional capacitance. An increase in the displacement current through the crystal causes the motional capacitance to increase. However, it is also found that motional capacitance associated with certain anharmonic overtones can be significantly reduced by modifying the electrode size and shape.

The present inventors have found that by optimizing the aspect ratio of the resonator (R/t) the frequency separation of unwanted or spurious anharmonic overtones from the main mode of resonance may be increased. As used herein, "aspect ratio" means the radius of curvature (R) of the resonator divided by the thickness of the resonator at the center (t). Note FIG. 6. Tables 3 and 4 below depict examples of spectra versus resonator aspect ratio (R/t) to illustrate separation of unwanted anharmonic overtones from the main mode of resonance by selection of the aspect ratio. The inventors further noted that a fundamental mode of resonance provides exceptional benefits since Q of a resonator, i.e., quality factor defined as stored energy/dissipated energy, is improved; and the resonator has a lower frequency of operation and is more tolerant to surface finish.

TABLE 3

| R/t | n, m, p | B-mode kHz | C-mode KHz |
|---|---|---|---|
| 150 | 1, 0, 0 | 2902 | 2650 |
|  | 1, 0, 2 | 3063 | 2940 |
|  | 1, 0, 4 | 3216 | 3203 |
|  | 1, 2, 0 | 3176 | 2792 |
|  | 1, 2, 2 | 3323 | 3068 |
|  | 1, 2, 4 | 3464 | 3321 |
|  | 1, 4, 0 | 3427 | 2926 |
|  | 1, 4, 2 | 3564 | 3190 |
|  | 1, 4, 4 | 3696 | 3434 |

Nearest anharmonic overtones: C(1, 0, 2) − B(1, 0, 0) = 38 kHz; and C(1, 4, 0) − B(1, 0, 0) = 24 kHz.

TABLE 4

| R/t | n, m, p | B-mode kHz | C-mode kHz |
|---|---|---|---|
| 120 | 1, 0, 0 | 2333 | 2132 |
|  | 1, 0, 2 | 2476 | 2388 |
|  | 1, 0, 4 | 2611 | 2619 |
|  | 1, 2, 0 | 2576 | 2257 |
|  | 1, 2, 2 | 2706 | 2500 |
|  | 1, 2, 4 | 2830 | 2722 |
|  | 1, 4, 0 | 2797 | 2376 |
|  | 1, 4, 2 | 2917 | 2608 |
|  | 1, 4, 4 | 3032 | 2821 |

Nearest anharmonic overtones: C(1, 0, 2) − B(1, 0, 0) = 55 kHz; and C(1, 4, 0) − B(1, 0, 0) = 43 kHz.

Figure 7:
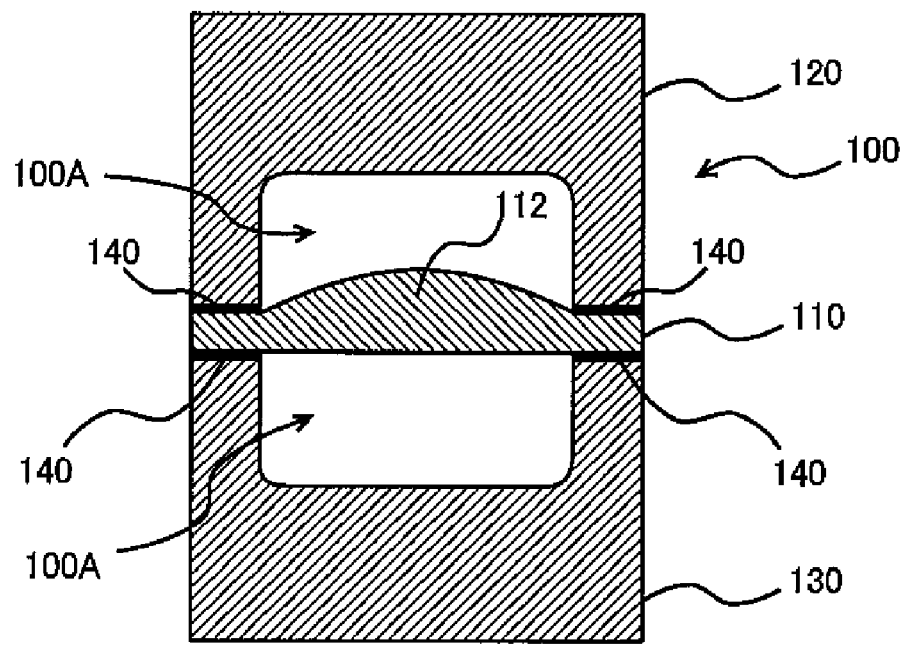
FIG. 7 is a cross-sectional view of one exemplary pressure transducer according to the disclosure herein.

Referring to FIG. 7, end caps 120, 130 are axi-symmetrical and have the same external shape. Inner portions of the end caps 120, 130 facing the resonator 112 are recessed to a predefined depth to correspond to the resonating element located in a central region of the plate 110. The end caps 120, 130 are attached to ends of the plate 110 via appropriate bonding interfaces 140 so as to define a cavity 100A within which the resonator 112 is located. The cavity 100A may have a vacuum or be filled with inert gas. In some cases, the end caps 120, 130 may be secured or glued to the edges of the plate 110, and the bonding interfaces 140 may be provided with bonding layers of appropriate bonding material.

For example, the end caps 120, 130 may be glued to the plate 110 by means of glass material as the bonding interface 140, with appropriate heat treatment. The glass material may be deposited on at least one of the end caps 120, 130 and plate 110, for example, by using a paste that contains glass frit and organic solution deposited through a screen mesh. The end caps 120, 130 and plate 110 may be bonded via the glass material under a heating process at a predetermined temperature suitable for the bonding. In another example, the end caps 120, 130 may be directly attached to the plate 110 without glass material, or any other material, at the bonding interface 140 by, for example, fusion bonding, metal-metal bonding, as described in, for example, O. Vallin, et. al., "Direct bonded quartz resonators", Frequency Control Symposium and PDA Exhibition, 2001, Proceedings of the IEEE International, pp. 345-348, 6-8 Jun. 2001. In metal-metal bonding, a metal layer as the bonding interface 140 may be deposited on the bonding surfaces of the end caps 120, 130 and the plate 110. The end caps 120, 130 and the plate 110 may be bonded via the metal bonding layer 140. Direct quartz bonding may require flat bonding surfaces for both parts of the plate 110 and end caps 120, 130 as shown in FIGS. 5A, 5C and 5E.

Methods for forming pressure transducers from crystalline quartz materials are described in, for example, U.S. Pat. Nos. 4,547,691, 5,394,345, 3,617,780, 5,417,882 and PCT/IB98/

101397. The United States patents are incorporated herein by reference in their entirety. For example, a plano-convex resonator may be fabricated by hand polishing, or by 3D numerically controlled machining.

Figure 8:
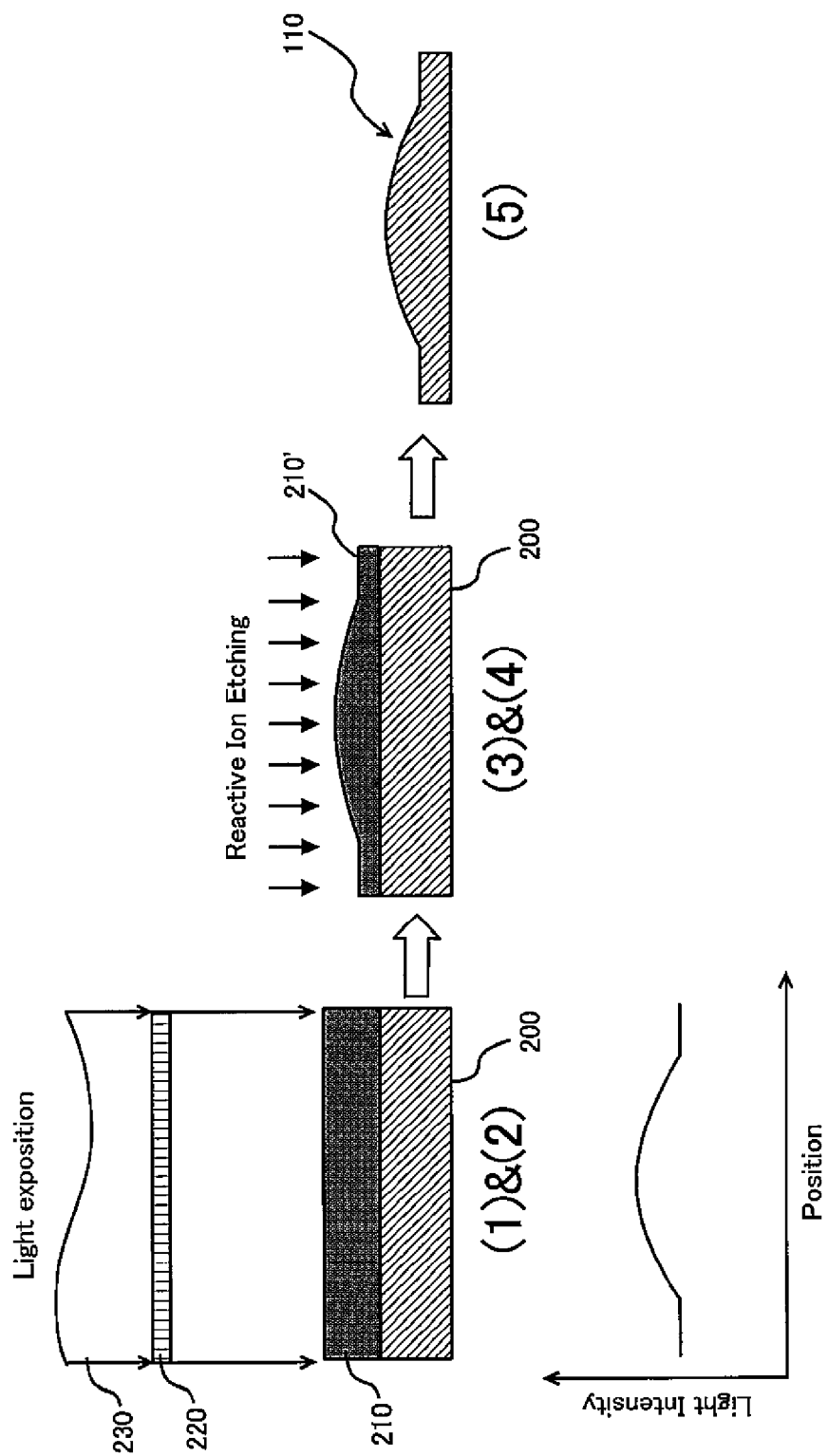
FIG. 8 shows one process for forming a plano-convex resonator according to the disclosure herein.

FIG. 8 shows one exemplary process for forming a plate 110 with a plano-convex resonating element 112 of the transducer 100, as an easy, low cost and reproducible process for a convex shape with high quality surface finish. The process may be suitable for forming a miniaturized transducer with a plano-convex resonator. Referring to FIG. 8, the process includes (1) coating a photoresist 210 on a quartz plate 200, (2) exposing a light pattern 230 passing through a photo mask 220 onto the coated photoresist 210, (3) developing the exposed photoresist 210, (4) etching the quartz plate 200, via the developed photoresist pattern 210, by RIE (reactive ion etching), and (5) removing residual photoresist to obtain a plate 110 with a plano-convex resonator. The photoresist may be coated on the quartz plate 200 with a spinner The photoresist may be either a positive type or a negative type. Depending on the photoresist type, a positive and negative pattern of the mask 220 may be reversed. The mask pattern is designed so that the profile of light intensity is a cylindrically symmetrical pattern determining the desired convex shape, as shown in FIG. 8. Because the photoresist 210 is selected so as to have a similar RIE rate to that of quartz, the convex shape of the photoresist 210 may be transcribed onto the quartz plate 200. The fabrication method may provide a way similar to that used in conventional semiconductor technology, and enable fabrication of a plurality of resonators on a single quartz plate simultaneously, which may be diced into separate resonators. Accordingly, the present fabrication method may be used to increase output of the transducers and to reduce fabrication costs. Also, by using the present fabrication process, it is easier to make a planar/flat area surrounding a plano-convex resonator, as shown in FIG. 5A, wherein the flat area may be necessary for fusion bonding and metal-metal bonding, as described above.

As disclosed herein, pressure transducer 100 comprises a resonator 112 located in a radial plane within an axi-symmetric housing of the pressure transducer 100. An axi-symmetric structure for the pressure transducer 100 reduces stress concentration in the transducer. Accordingly, stable pressure measurements for high-pressure operational ranges can be obtained with the transducer 100. Moreover, automatic lapping/polishing processes, shorter manufacturing lead-time, and lower manufacturing costs are possible with the transducer 100 having an axi-symmetric structure. It is also possible to develop a relatively small size transducer. Furthermore, since the resonator 112 is formed from double rotation cut quartz (piezoelectric material) capable of vibrating in dual modes of fast and slow thickness-shear vibrations, pressure and temperature can be measured simultaneously at the same resonator 112. Accordingly, fast and accurate temperature compensation for pressure readings may be performed without another temperature measuring device near the transducer 100.

Figure 9:
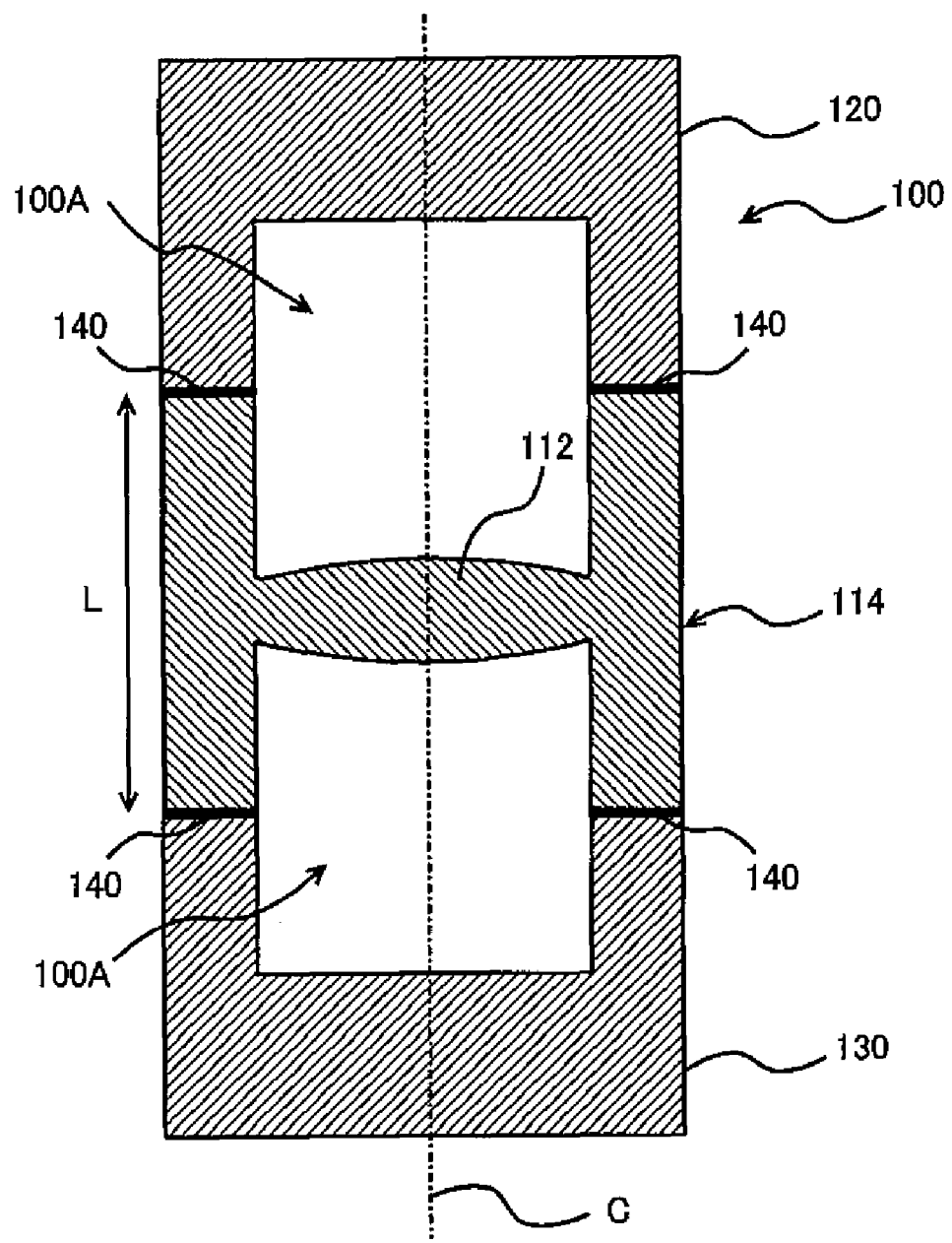
FIG. 9 shows another exemplary pressure transducer according to the disclosure herein.

FIG. 9 shows yet another embodiment of a pressure transducer 100 comprising a resonator 112 having a body section 114 instead of the plate-like structure 110 described above. The body section 114 may have a cylindrical outer shape and be generally H-shaped in cross section. End caps 120, 130 are provided at ends of the body section 114, attached via bonding interfaces 140, and resonator 112 may have a bi-convex shaped resonating element located in a radial plane within the transducer 100. By adjusting length L of the extended portions of the section 114, shear stress at the bonding interfaces 140 may be reduced so that more stable pressure measurements can be performed. It has been found that the substantially symmetrical structure of the bi-convex resonator makes the transducer stronger than an asymmetrical structure so that pressure measurements in higher pressure ranges are possible.

Figure 10A:
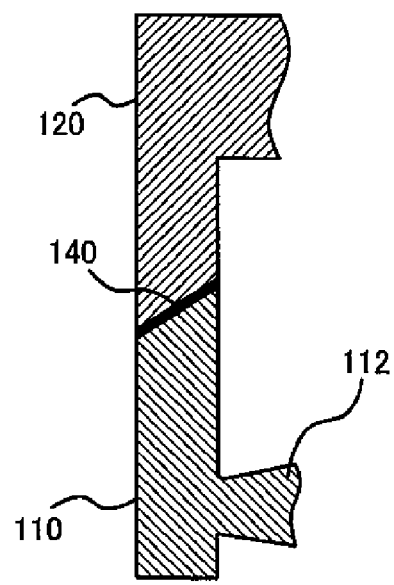
FIGS. 10A and 10B show other examples of bonding interface between a main body section and end caps as discussed herein.
Figure 10B:
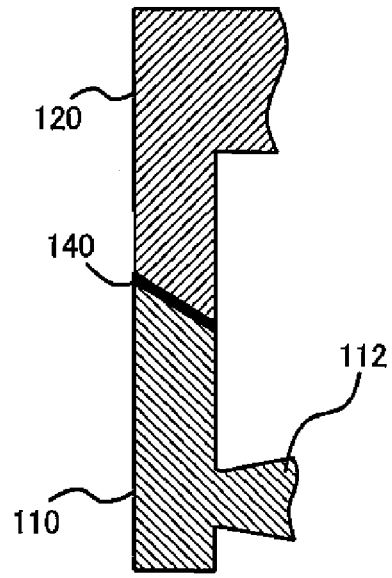

FIG. 9 depicts the bonding interfaces 140 as perpendicular to axis C of the transducer 100. However, other cross sectional shapes of the bonding interfaces 140, for example, rounded or beveled as shown in FIGS. 10A and 10B, may also be adopted.

Figure 11:
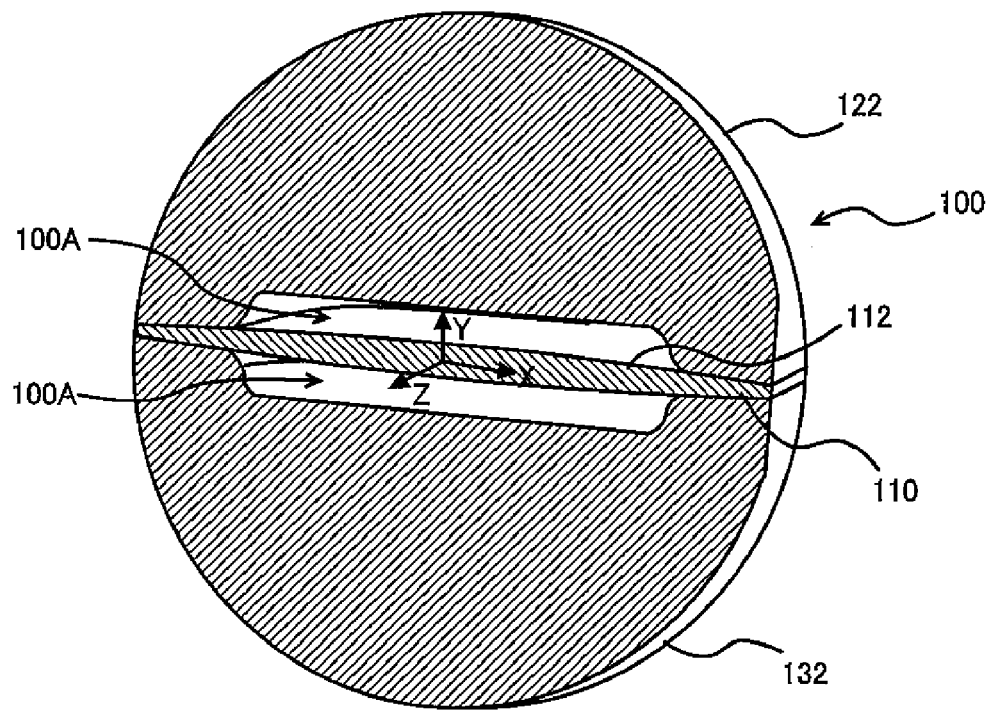
FIG. 11 shows another exemplary pressure transducer according to the present disclosure.

FIG. 11 shows yet another pressure transducer according to the present invention having end caps 122, 132 with an outer shape that is hemispherical. Transducer 100 has reduced hysteresis and long-term drift in output of the transducer, and reduced shear stress at bonding interface layers between the end caps 122, 132 and the plate 110. Other shapes similar to the hemispherical shape depicted in FIG. 11 may be used, and internal surfaces of the end caps 122, 132 may be shaped so that cavity 100A may be rectangular in shape, as shown in FIG. 11, or have another suitable shape, such as circular, oval, or some other cross sectional shape.

Figure 12:
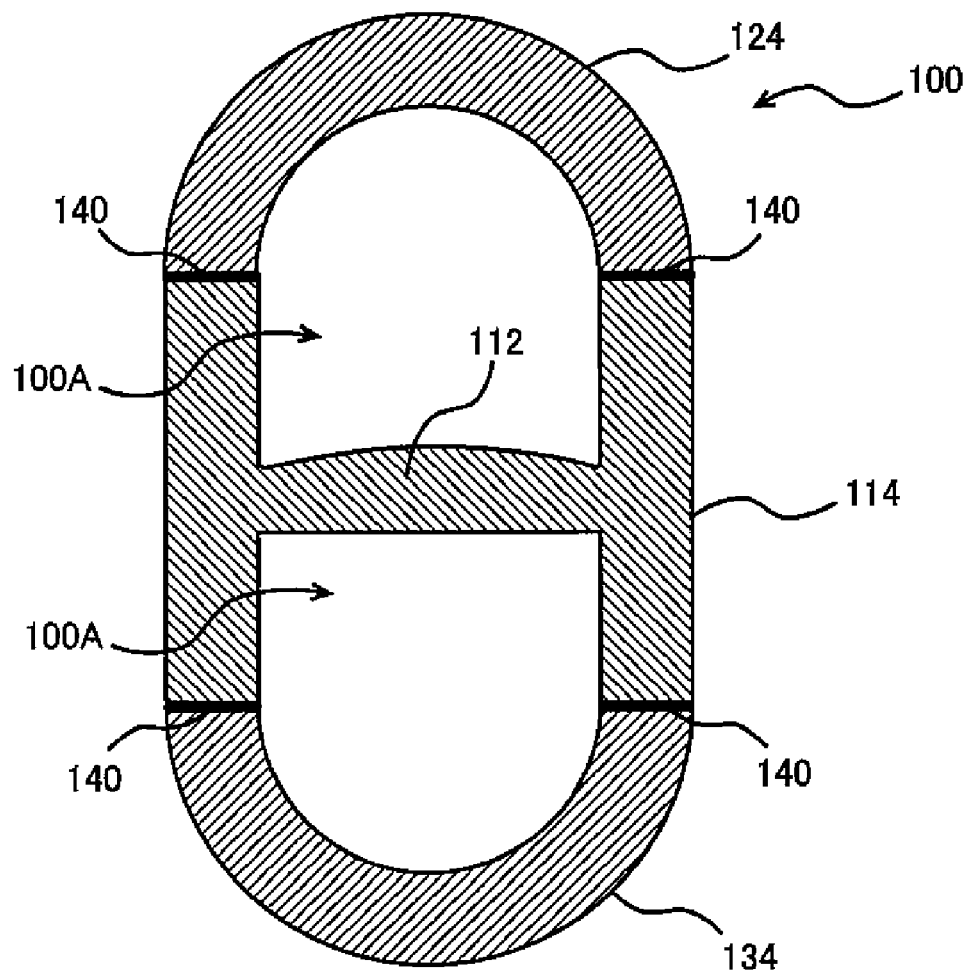
FIG. 12 shows yet another exemplary pressure transducer according to the present disclosure.

FIG. 12 depicts a pressure transducer having end caps 124, 134 with hemispherical external surfaces and having internal surfaces that are also hemispherical in shape. The transducer 100 has reduced shear stress at bonding interface layers between end caps 124, 134 and ends of the H-shaped section 114, and reduced hysteresis and long-term drift in output of the transducer 100. Other shapes may be provided for the external and internal surfaces of the end caps 124, 134, as shown in FIG. 9 and described above.

Figure 13:
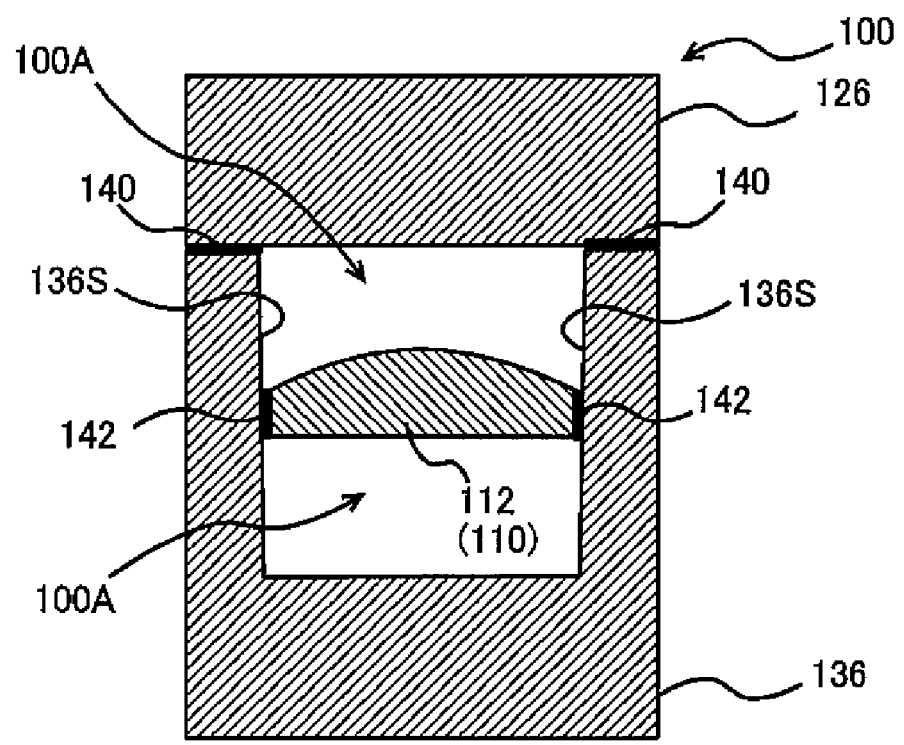
FIG. 13 shows yet another exemplary pressure transducer according to the present disclosure.

FIG. 13 shows yet another pressure transducer with a resonator located within a cylindrical main body section 136 having one end closed and the other end open. An end-cap 126 is attached to the open end of the main body section 136, via a bonding interface layer 140. Resonator 112 is located in a central portion of the body section 136 and is connected to an internal surface 136S of the body section 136, via a bonding interface layer 142, so as to minimize shear stress at the bonding interface 142 under hydrostatic pressure. The internal surface 136S of the body section 136 may be tapered so that the top diameter of internal cavity 100A of the body section 136 is greater than the diameter at the bottom of the cavity 100A.

Figure 14:
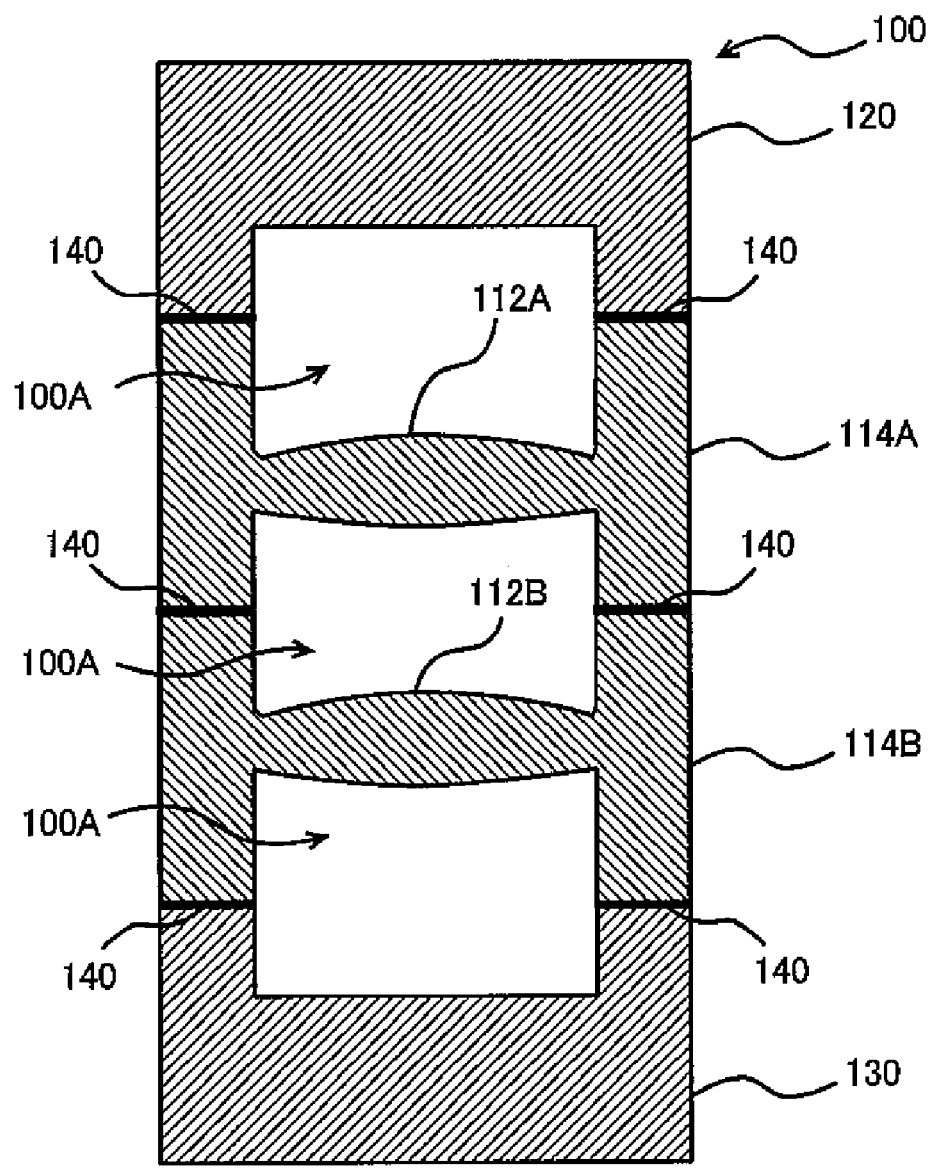
FIG. 14 shows yet another exemplary pressure transducer according to the present disclosure.

FIG. 14 shows yet another aspect of a pressure transducer according to the present invention having a plurality of generally H-shaped main body sections 114A, 114B between end caps 120, 130. Outputs from the bi-convex resonators 112A, 112B may be used by averaging them so as to improve accuracy of the pressure measurements. For example, one resonator 112A may be used for normal pressure measurements and the other resonator 112B may be used as a backup resonator. Accordingly, a dual resonator type transducer as disclosed herein provides reduced metrological uncertainties that may be caused by multiple measurements from one transducer, and ensures fail-safe operation due to the backup resonator.

Figure 15:
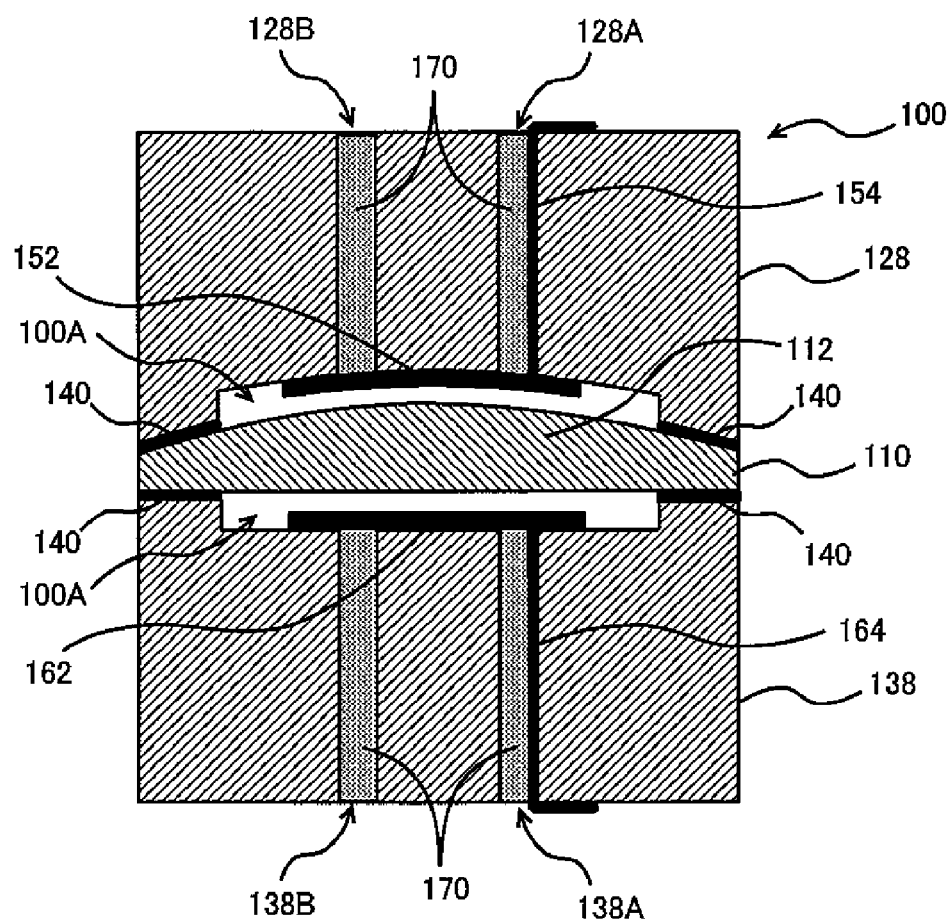
FIG. 15 shows yet another exemplary pressure transducer according to the present disclosure.

FIG. 15 shows another pressure transducer having electrodes 152, 162 that are not in contact with resonator 112. The electrodes may be provided on inner surfaces of end caps 128, 138 so as to be separated from the resonator surface. The clearance may be set so that thickness-shear vibrations are excited in the resonator 112 by an electric field formed between the electrodes 152, 162. Through-holes 128A, 128B, 138A, 138B with wiring 154, 164 are provided in the end caps for electrical connection between the electrodes 152, 164 and external electrodes 156, 166 on outer surfaces of the end caps 128, 138. Thickness-shear vibrations in the resonator 112 may be excited by capacitive coupling between the noncontact electrodes and the quartz resonator 112. The gap between the electrodes 152, 164 and the resonator surface may be kept in the order of a few micrometers, for example, 10 micrometers for the capacitive coupling. After fabrication of the electrodes 152, 162 on the internal surfaces of the end caps 128, 138, the end caps are attached to the plate 110, via bonding interfaces 140, by fusion bonding, for example. Through-holes 128A, 128B, 138A, 138B may be filled with sealing material 170 by vacuum sealing. Low acoustic losses are obtainable and long-term stability can be improved by avoiding invasion of electrode material into the quartz resonator 112.

Figure 16:
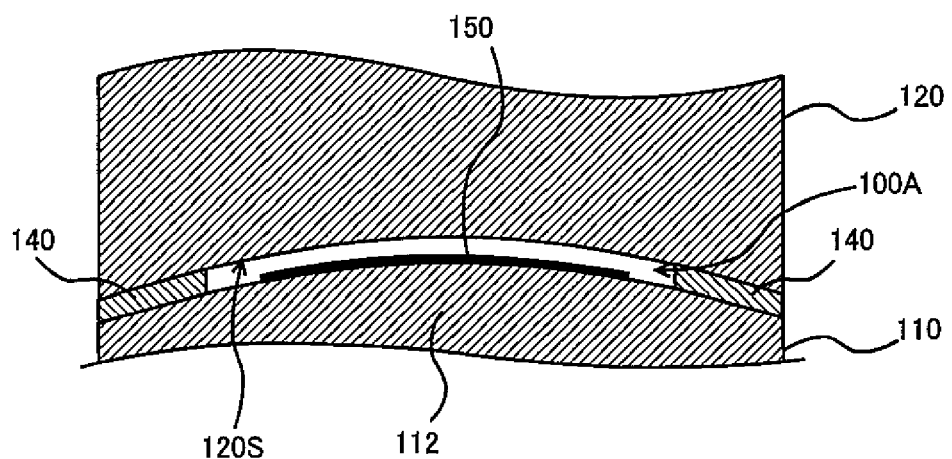
FIG. 16 shows yet another exemplary pressure transducer according to the present disclosure.

FIG. 16 shows yet another example of a pressure transducer according to the present disclosure wherein an inner surface 120S of end cap 120 is contoured so as to be proximate to the surface of resonator 110. End cap 120 may be attached to circumferential portions of resonator plate 110 with bonding layer 140. A space corresponding to the thickness of the layer 140 separates the inner surface 120S from the surface of the plate 110. Thickness of the layer 140 may be selected so that inner surfaces of the end caps do not touch the electrodes under hydrostatic pressure. At high hydrostatic pressures around the transducer 100, the default stress in the quartz material of the transducer, i.e., minimum stress with zero stress amplification, may already be high. By the present transducer, stress level may be kept almost constant under hydrostatic pressure.

Figure 17:
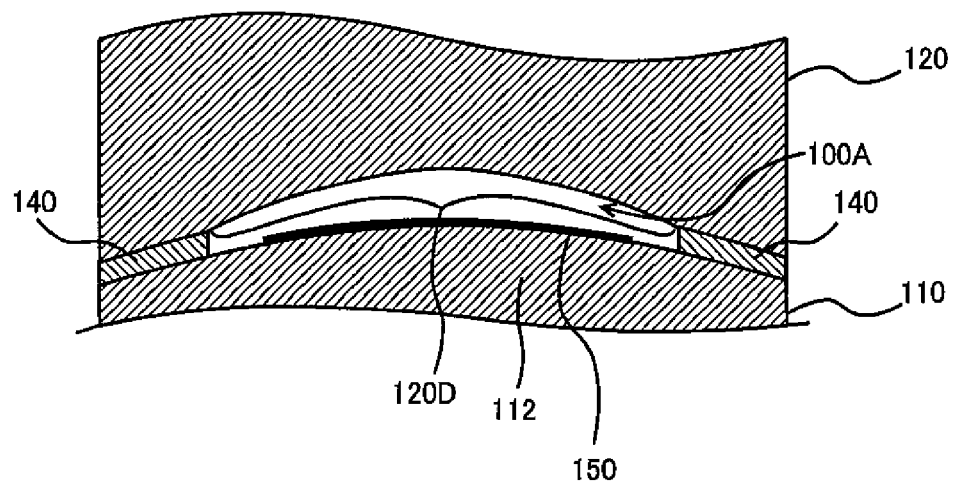
FIG. 17 shows yet another exemplary pressure transducer according to the present disclosure.

A recessed portion 120D, shown in FIG. 17, may be provided to account for large deformations in end cap 120 which may cause the end cap to touch the electrode 150. In consequence, separation between the inner surface of the end cap and the resonator would be greater than the thickness of the layer 140.

A pressure transducer may be configured with an SBTC cut resonator as described herein and combined with suitable circuitry to provide a pressure measurement device that is capable of precise pressure measurements.

Figure 18:
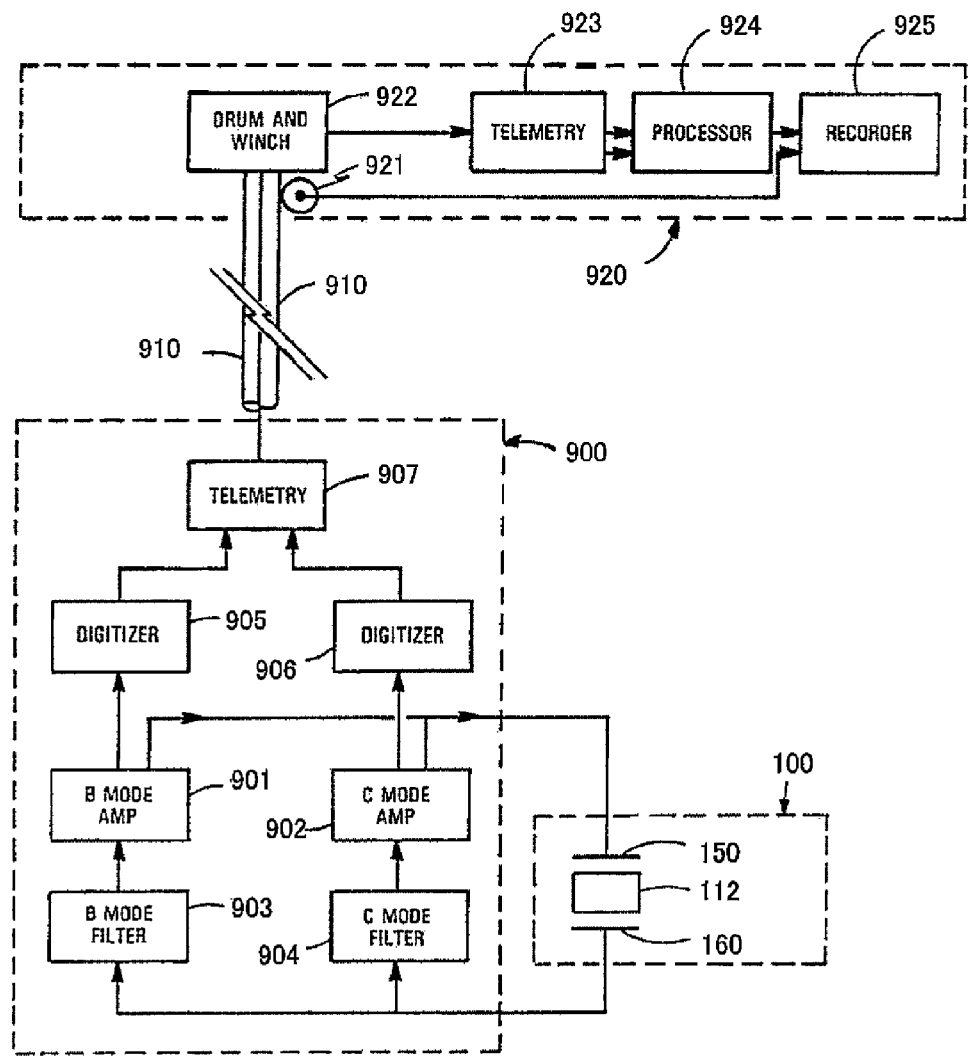
FIG. 18 is a schematic diagram of one exemplary apparatus for measuring pressures in a well passing through earth formations in accordance with the present disclosure.

FIG. 18 is a schematic representation of one precision pressure measurement system for use in the exploration and production of hydrocarbons. A quartz pressure transducer 100 comprises a quartz resonator 112 having, for example, an SBTC cut and disposed between electrodes 150, 160. The pressure transducer 100 and associated downhole electronics 900 may be associated with, for example, a downhole tool to take formation fluid pressures. The resonator 112 may be configured to operate in the B and C modes of vibration by application of an AC signal to electrodes 150, 160 by amplifiers 901 and 902. Filters 903 and 904, having appropriate filter constants, such as poles and/or zeros relative to the B and C frequencies modes, are provided to separate the energy from the variation in the two modes of the single pair of electrodes 150, 160.

The B and C mode signals from amplifiers 901 and 902 are applied to respective digitizers 905 and 906. The digitized signals are applied to telemetry system 907 where they are multiplexed and transmitted to surface equipment 920, for example, via an armored cable 910.

For example, a logging device may be suspended in a borehole on the armored cable 910, the length of which substantially determines the relative depth of the logging device. The length of armored cable 910 is controlled by suitable means at the surface, such as a drum and winch mechanism 922. The armored cable 910 is rewound on the drum to raise the logging device toward the surface as measurements are taken. Depth measurements are provided by a measure wheel 921, or another suitable means for depth measurements. Telemetry signals transmitted over armored cable 910 are supplied to telemetry system 923. The signals are demultiplexed and digital frequency information for the B and C modes is supplied to processor 924. Processor 924 determines the temperature compensated pressure in accordance with known methods, such as a curve fitting routine, or any other suitable method, and supplies this information to recorder 925 which, receiving depth information from measure wheel 921, records pressure as a function of depth.

In some aspects, surface temperature of the pressure transducer 100 may be measured for accurate thermal compensation of pressure values obtained by a pressure transducer, as described in co-pending and commonly owned U.S. patent application Ser. No. 11/307,217, which is incorporated herein by reference in its entirety.

The surface temperature of a pressure gauge may be obtained with a thermometer. For example, an RTD type temperature measurement device may be used as the thermometer and may be attached to the peripheral surface of the resonator. In this, a thin film Pt resistor may be deposited directly on the quartz surface. The Pt resistor is also sensitive to pressure, but its pressure dependency is repeatable. Both the pressure sensor and thermometer may be calibrated simultaneously to temperature and pressure measurements.

Figure 19:
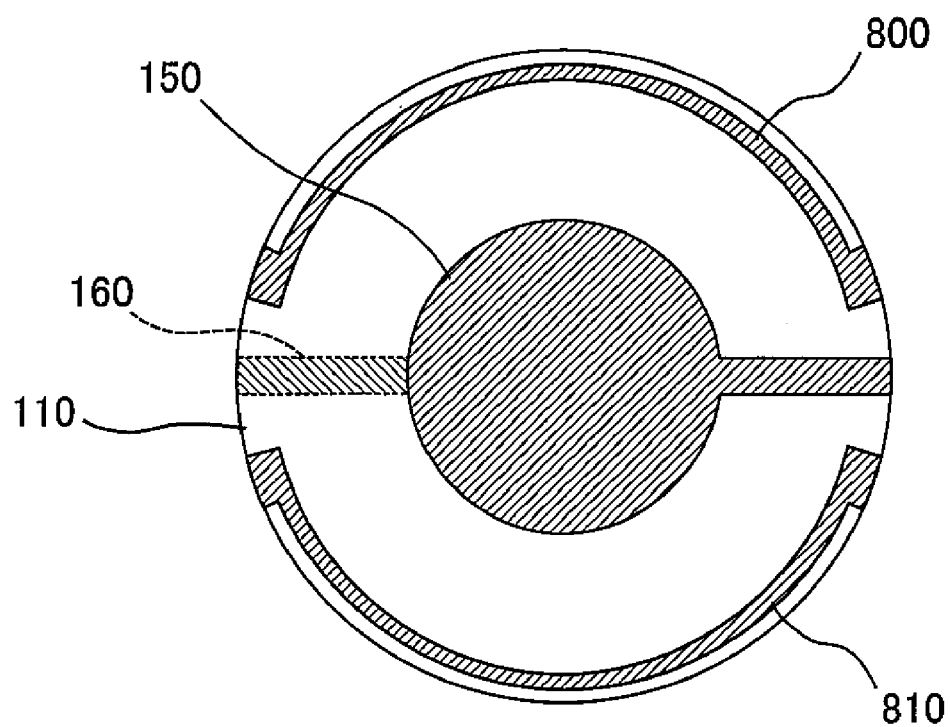
FIG. 19 shows one exemplary pressure transducer with thin film thermal resistors.

FIG. 19 shows one exemplary pressure transducer with thin film thermal resistors 800 and 810. Electrodes 150 and 160 for vibration of a resonator plate 110 are located at a central portion of opposite surfaces of the resonator plate 110. The thin film thermal resistors 800 and 810 are located on a surface of the resonator plate 110 in the vicinity of a peripheral surface of the plate 110 that is exposed to oil. Although two thin film thermal resistors are depicted in FIG. 19, one or more resistors may be provided as desirable or necessary for the purposes described herein. Various methods may be used for fabrication of the thin film thermal resistors. In this, a sputtering method is preferable for a uniform and stable thin film with relatively simple apparatus, although other fabrication methods may also be used.

Figure 20:
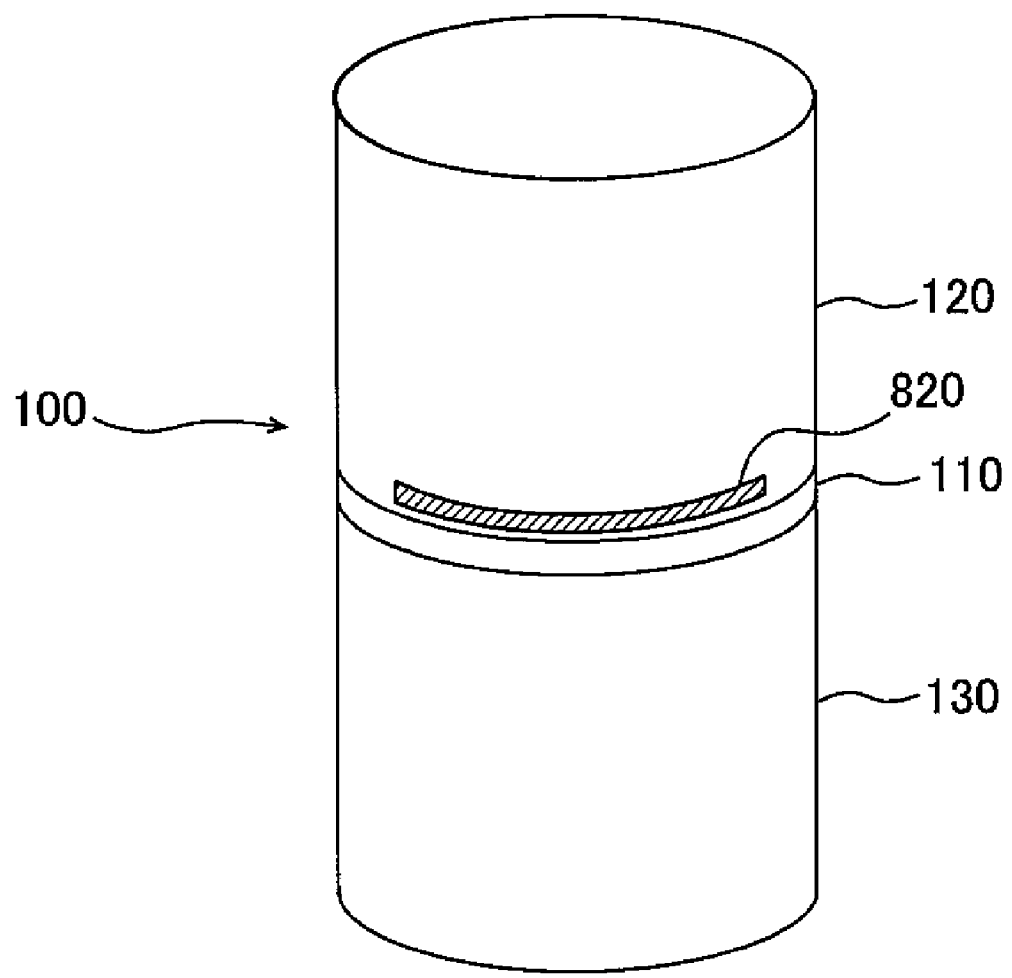
FIG. 20 shows another exemplary pressure transducer with thin film thermal resistor.

FIG. 20 shows a pressure transducer 100 according to the present disclosure having a thin film thermal resistor 820 disposed on an external surface thereof. The thin film thermal resistor 820 may be located on at least one of the outer surfaces of end caps 120, 130 such that the resistor 820 is located in the vicinity of resonator plate 110.

The preceding description has been presented only to illustrate and describe certain embodiments. It is not intended to be exhaustive or to limit the invention to any precise form disclosed. Many modifications and variations are possible in light of the above teaching.

The embodiments and aspects were chosen and described in order to best explain principles of the invention and its practical applications. The preceding description is intended to enable others skilled in the art to best utilize the principles in various embodiments and aspects and with various modifications as are suited to the particular use contemplated. It is intended that the scope of the invention be defined by the following claims.

What is claimed is:

1. A pressure transducer comprising:
 a housing, and
 a piezoelectric solid resonator located in the housing,
 wherein the resonator comprising double rotation cut piezoelectric quartz material that vibrates in B(1,0,0), the fundamental harmonic of the B-mode of vibration, and C(1,0,0), the fundamental harmonic of the C-mode of vibration, wherein an aspect ratio (R/t) of the resonator imparts a frequency separation equal to or greater than 24 kHz between B(1,0,0) and C(1,4,0), an anharmonic of the C-mode of vibration, and wherein R is a radius of curvature of the resonator and t is a thickness of the resonator at the center.

2. The transducer according to claim 1, wherein the resonator is an SBTC-cut quartz piezoelectric resonator.

3. The transducer according to claim 1, wherein the resonator comprises a bi-convex resonator located in a radial plane of the housing such that the pressure transducer comprises an axi-symmetrical configuration.

4. The transducer according to claim 1, wherein:
the housing is axi-symmetrical;
the resonator is located in a radial plane within the housing; and
the peripheral portion is sandwiched between end caps of the housing.

5. The transducer according to claim 4, wherein the end caps are fusion bonded to the peripheral portion of the resonator.

6. The transducer according to claim 4, wherein the end caps are bonded to the peripheral portion of the resonator by metal-metal bonding.

7. The transducer according to claim 4, wherein the end caps are bonded to the peripheral portion of the resonator by glass sealant.

8. The transducer according to claim 4, wherein each end cap comprises at least one of an inner surface and an outer surface that is curved.

9. The transducer according to claim 4, further comprising a respective resonator electrode on an inner surface of each end cap such that the electrodes are not in contact with the resonator.

10. The transducer according to claim 9, wherein:
each end cap has at least one aperture with wiring for electrical connection between the inner surface electrodes and corresponding external electrodes on outer surfaces of the end caps; and
the apertures are filled with sealant.

11. The transducer according to claim 1, wherein the resonator is a bi-convex resonator.

12. The transducer according to claim 1, wherein the resonator is a plano-convex resonator.

13. The transducer according to claim 1, wherein the resonator has different radii of curvature along two orthogonal axes thereof.

14. The transducer according to claim 1, wherein:
the housing comprises a body section that is cylindrical in shape;
at least one end cap at one end of the body section;
the resonator is located in a radial plane of the housing within the body section.

15. The transducer according to claim 1, further comprising a pair of end caps at opposite ends of the body section; and
each end cap having at least one surface that is hemispherically curved.

16. The transducer according to claim 1, wherein the resonator has different radii of curvature along two orthogonal axes thereof.

17. The transducer according to claim 1, wherein:
the housing is axi-symmetrical;
the resonator is located in a radial plane within the housing, the resonator comprising a peripheral portion sandwiched between end caps of the housing; and
an inner surface of at least one end cap is contoured so as to be adjacent to a surface of the resonator.

18. The transducer according to claim 17, further comprising a bonding layer between the at least one end cap and the peripheral portion of the resonator, wherein
the contoured inner surface of the at least one end cap is separated from the surface of the resonator with a constant gap that is equal to the thickness of the bonding layer.

19. The transducer according to claim 17, further comprising a bonding layer between the at least one end cap and the peripheral portion of the resonator, wherein
the contoured inner surface of the at least one end cap is separated from the surface of the resonator with a gap that is greater than the thickness of the bonding layer.

20. The transducer according to claim 1, wherein:
the housing is axi-symmetrical; and
the resonator is located in a radial plane within the housing, the resonator comprising a peripheral portion sandwiched between end caps of the housing and having a generally H-shape in cross section.

21. The transducer according to claim 1, further comprising:
resonator electrodes configured or designed for inducing the fundamental harmonic of the B-mode of vibration and the fundamental harmonic of the C-mode of vibration in the resonator, wherein
the resonator electrodes are configured or designed to maximize the motional capacitance of at least the fundamental tone and to reduce the motional capacitance of unwanted anharmonics under a predetermined level.

22. The transducer according to claim 1, wherein the piezoelectric resonator comprises quartz crystal with a double rotation cut of angles $\phi$(phi)=16.3 degrees, plus or minus 4 degrees, and $\theta$(theta)=−34.5 degrees, plus or minus 4 degrees.

23. The transducer according to claim 1, wherein the piezoelectric resonator comprises quartz crystal with a double rotation cut of angles $\phi$(phi)=1 degree, plus or minus 4 degrees, and $\theta$(theta)=−23 degrees, plus or minus 4 degrees.

24. The transducer according to claim 1, wherein the piezoelectric resonator comprises quartz crystal with a double rotation cut of angles $\phi$(phi)=13 degrees, plus or minus 4 degrees, and $\theta$(theta)=−27.5 degrees, plus or minus 4 degrees.

25. The transducer according to claim 1, wherein the piezoelectric resonator comprises quartz crystal with a double rotation cut of angles $\phi$(phi)=14.2 degrees, plus or minus 4 degrees, and $\theta$(theta)=−degrees, plus or minus 4 degrees.

26. The pressure transducer of claim 1, wherein the frequency separation is equal to or greater than 43 kHz.

27. The pressure transducer of claim 1, wherein the aspect ratio (R/t) of the resonator imparts a frequency separation equal to or greater than 38 kHz between B(1,0,0) and C(1,0,2), an anharmonic of the C-mode of vibration.

28. A method comprising:
assembling a pressure transducer comprising a housing and a piezoelectric resonator located in the housing, wherein
the resonator comprises double rotation cut piezoelectric quartz material that vibrates in B(1,0,0), the fundamental harmonic of the B-mode of vibration, and C(1,0,0), the fundamental harmonic of the C-mode of vibration; and
selecting an aspect ratio (R/t) of the resonator that imparts a frequency separation equal to or greater than 24 kHz between B(1,0,0) and C(1,4,0), an anharmonic of the C-mode of vibration.

29. The pressure transducer according to claim 28, wherein the selecting an aspect ratio (R/t) of the resonator selects an aspect ratio (R/t) to control a quality factor (Q) defined as stored energy divided by dissipated energy.

30. A tool for pressure measurements comprising:
a pressure transducer; and
a temperature sensor disposed on or near an outer surface of the pressure transducer,
wherein the transducer comprises an axi-symmetrical housing with end caps and a piezoelectric quartz resonator located in a radial plane within the housing,
wherein the resonator comprises double rotation cut piezoelectric quartz material that vibrates in B(1,0,0), the fundamental harmonic of the B-mode of vibration, and C(1,0,0), the fundamental harmonic of the C-mode of vibration,
wherein an aspect ratio (R/t) of the resonator imparts a frequency separation equal to or greater than 24 kHz between B(1,0,0) and C(1,4,0), an anharmonic of the C-mode of vibration, and
wherein R is a radius of curvature of the resonator and t is a thickness of the resonator at the center.

31. A pressure transducer comprising:
a housing, and
a piezoelectric solid resonator located in the housing,
wherein the resonator comprises double rotation cut piezoelectric quartz material that vibrates in B(1,0,0), the fundamental harmonic of the B-mode of vibration, and C(1,0,0), the fundamental harmonic of the C-mode of vibration,
wherein an aspect ratio (R/t) of the resonator imparts a frequency separation equal to or greater than 38 kHz between B(1,0,0) and C(1,0,2), an anharmonic of the C-mode of vibration, and
wherein R is a radius of curvature of the resonator and t is a thickness of the resonator at its center.

32. The pressure transducer of claim 31, wherein the frequency separation is equal to or greater than 55 kHz.

* * * * *